(12) United States Patent
Lin

(10) Patent No.: US 11,395,423 B2
(45) Date of Patent: Jul. 19, 2022

(54) LOCKING MECHANISM

(71) Applicant: LANNER ELECTRONICS INC., New Taipei (TW)

(72) Inventor: Tse-Min Lin, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 278 days.

(21) Appl. No.: 16/893,441

(22) Filed: Jun. 5, 2020

(65) Prior Publication Data

US 2021/0259120 A1 Aug. 19, 2021

(30) Foreign Application Priority Data

Feb. 14, 2020 (TW) ................................ 109201659

(51) Int. Cl.
*H05K 7/20* (2006.01)
*H05K 5/02* (2006.01)
*E05C 5/04* (2006.01)
*G06F 1/18* (2006.01)
*E05C 5/00* (2006.01)

(52) U.S. Cl.
CPC ............. *H05K 5/0221* (2013.01); *E05C 5/04* (2013.01); *G06F 1/181* (2013.01); *E05C 2005/005* (2013.01); *E05Y 2900/606* (2013.01)

(58) Field of Classification Search
CPC ...... G06F 1/1601; G06F 1/181; H05K 5/0221
See application file for complete search history.

(56) References Cited

U.S. PATENT DOCUMENTS

| | | | | |
|---|---|---|---|---|
| 6,058,579 A * | 5/2000 | Brocklesby | .......... | H05K 7/1409 340/687 |
| 6,953,232 B2 * | 10/2005 | Busby | ................. | H05K 7/1409 292/196 |
| 9,226,425 B2 * | 12/2015 | Hsu | ...................... | H05K 7/1488 |
| 10,517,183 B1 * | 12/2019 | Huang | ................. | H05K 7/1487 |
| 10,863,647 B1 * | 12/2020 | Escamilla | ............. | H05K 5/023 |
| 11,266,035 B1 * | 3/2022 | Tsorng | ................ | H05K 7/1489 |
| 2006/0215373 A1 * | 9/2006 | Joist | ..................... | H05K 7/1409 361/726 |
| 2018/0168061 A1 * | 6/2018 | Liao | ........................ | G06F 1/185 |
| 2020/0107460 A1 * | 4/2020 | Rosedahl | ............. | H05K 7/1489 |
| 2022/0132694 A1 * | 4/2022 | Halli | ................... | H05K 5/0286 |

* cited by examiner

*Primary Examiner* — Anthony Q Edwards

(57) ABSTRACT

A locking mechanism for applying in a computer case is disclosed. The locking mechanism comprises: an actuating unit and a locking member. The actuating unit is pivotally connected to one of two vertically-disposed side plates of the computer case by one end thereof, and comprises a pivot member and a latching member. In the present invention, the actuating unit rotates along a first direction parallel to the vertically-disposed side plate, so as to decrease space required by operating the locking mechanism. Such that the locking mechanism brought advantages of great space-saving, high capacity and low cost of production cost.

6 Claims, 5 Drawing Sheets

LOCKING MECHANISM

BACKGROUND OF THE INVENTION

1. Field of the Invention

The present invention relates to the technology field of locking mechanism, and more particularly to a locking mechanism for saving space.

2. Description of the Prior Art

Along with the development of technology, there are significant changes and improvements in human life. For instance, E-commerce, Internet of Things (TOT), online game, and stream media are getting becoming such a part of human society. However, to facilitate each of the forgoing technologies, compressive installation and establishment of data centers are urgent needed. It is known that, sever plays the most important in a data center system. Therefore, it is extrapolated that, how to develop or design a device that includes advantages of great space-saving, high capacity, and low production cost has become the most important issue for the data center companies.

FIG. 1 illustrates a stereo view of a conventional locking mechanism. As shown in FIG. 1, a sliding member 3' is arranged to slide in a computer case 2'. The conventional locking mechanism 1' is pivotally connected to a bottom plate of the sliding member 3' by an actuating member 11' thereof. Moreover, when the actuating unit 11' is set to be in a locked state, one end of a locking member 12' of the locking mechanism 1' is fixed on a front plate 31' of the sliding member 3', and the other end of the locking member 12' protrudes from the front plate 31' and is fixed on a front plate of the computer case 2'. In the conventional locking mechanism 1', the locking unit 12' is rotated to be unscrewed by an external force to stop locking the front plate of the computer case 2'. Furthermore, the actuating unit 11' comprises an extension rod 111' and a connection rod 112' for controlling the actuating unit 11' more easily. More particularly, one end of the locking member 12' pivotally is connected to the bottom plate of the sliding member 3', and one end of the extension rod 111' is connected the other end of the connection rod 112'. The extension rod 111' extends along a direction parallel to the bottom plate, so as to enhance operational convenience of the extension rod 111'. Although the conventional locking mechanism 1' includes advantage of convenience, the locking mechanism 1' still has disadvantage as follows:

(1) As shown in FIG. 1, it is necessary to reserve a space between the computer case 2' and the front plate 31' to allow the extension rod 121' to be extended within the space. Therefore, the space decreases a space usage efficiency of the locking mechanism 1', such that the conventional locking mechanism 1' includes disadvantages of lower available spaces and high production cost.

From above descriptions, it should know that there is room for improvement in the conventional locking mechanism. In view of that, inventors of the present application have made great efforts to make inventive research and eventually provided a locking mechanism.

SUMMARY OF THE INVENTION

The primary objective of the present invention is to disclose a locking mechanism which comprises: an actuating unit and a locking member. The actuating unit is pivotally connected to one of two vertically-disposed side plates of a computer case by one end thereof, and comprises a pivot member and a latching member. In the present invention, the actuating unit rotates along a first direction parallel to the vertically-disposed side plate, so as to decrease space required by operating the locking mechanism. By such arrangements, the locking mechanism brought advantages of great space-saving, high capacity and low cost of production cost.

In order to achieve the primary objective of the present invention, the inventor of the present invention provides an embodiment for the locking mechanism for applying in a computer case that has two vertically-disposed side plates, and the locking mechanism comprises:

an actuating unit, being pivotally connected to one of the two vertically-disposed side plates, and comprising:
a pivot member, being pivotally connected to a connection portion of the vertically-disposed side plate by one end thereof;
a latching member, being connected to the other end of the pivot member, and being configured to lock a sliding member; wherein the sliding member is arranged to slide in the computer case;
a locking member, being connected to the latching member, and being configured to lock a front plate having at least one locking hole of the sliding member;
wherein in case of the actuating unit being set to be in a locked state, the latching member locking the front plate of the sliding member, and the locking member locking at least one locking hole of the front plate;
wherein a locking of the locking member to the front plate is released by a first external force;
wherein by applying a second external force to the actuating unit, the actuating unit rotating along a first direction parallel to the vertically-disposed side plate by taking the connection portion of the vertically-disposed side plate as a rotation, so as to switch the actuating unit to be in an unlocked state, such that the sliding member is allowed to be drawn out from the computer case.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a locking mechanism according to the present invention, embodiments of the present invention will be described in detail with reference to the attached drawings hereinafter.

Figure 1:
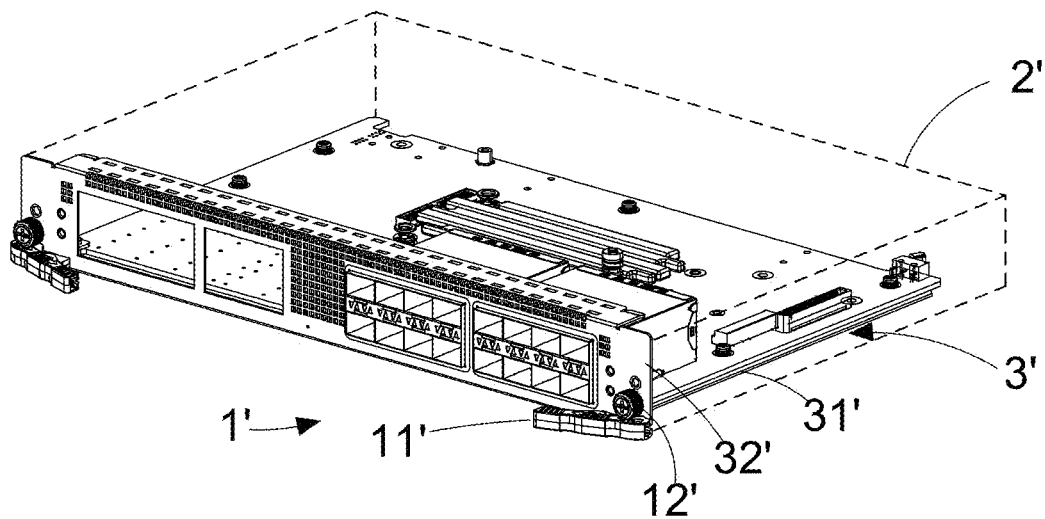
FIG. 1 shows a stereo view of a conventional locking mechanism.
Figure 1:
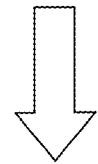
Figure 1:
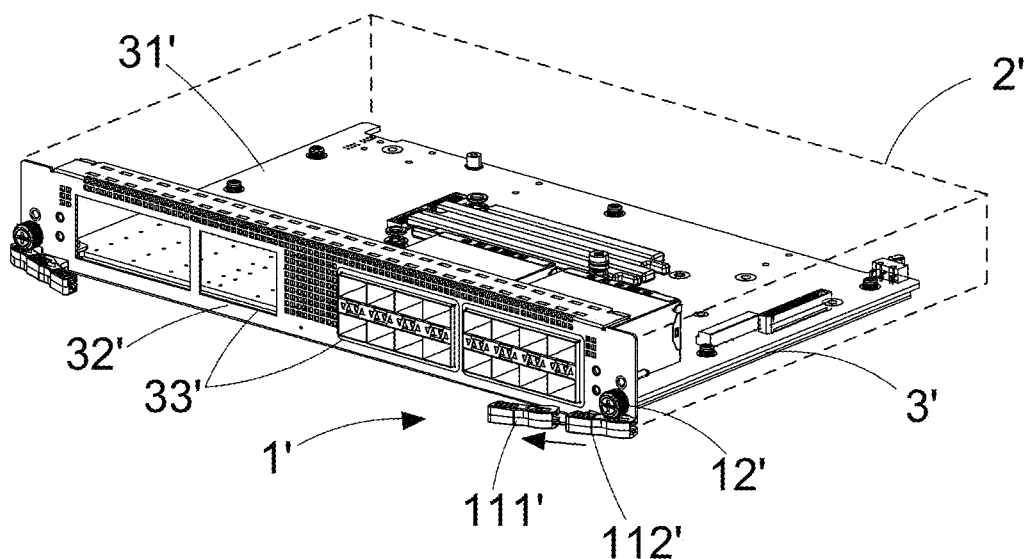
Figure 2:
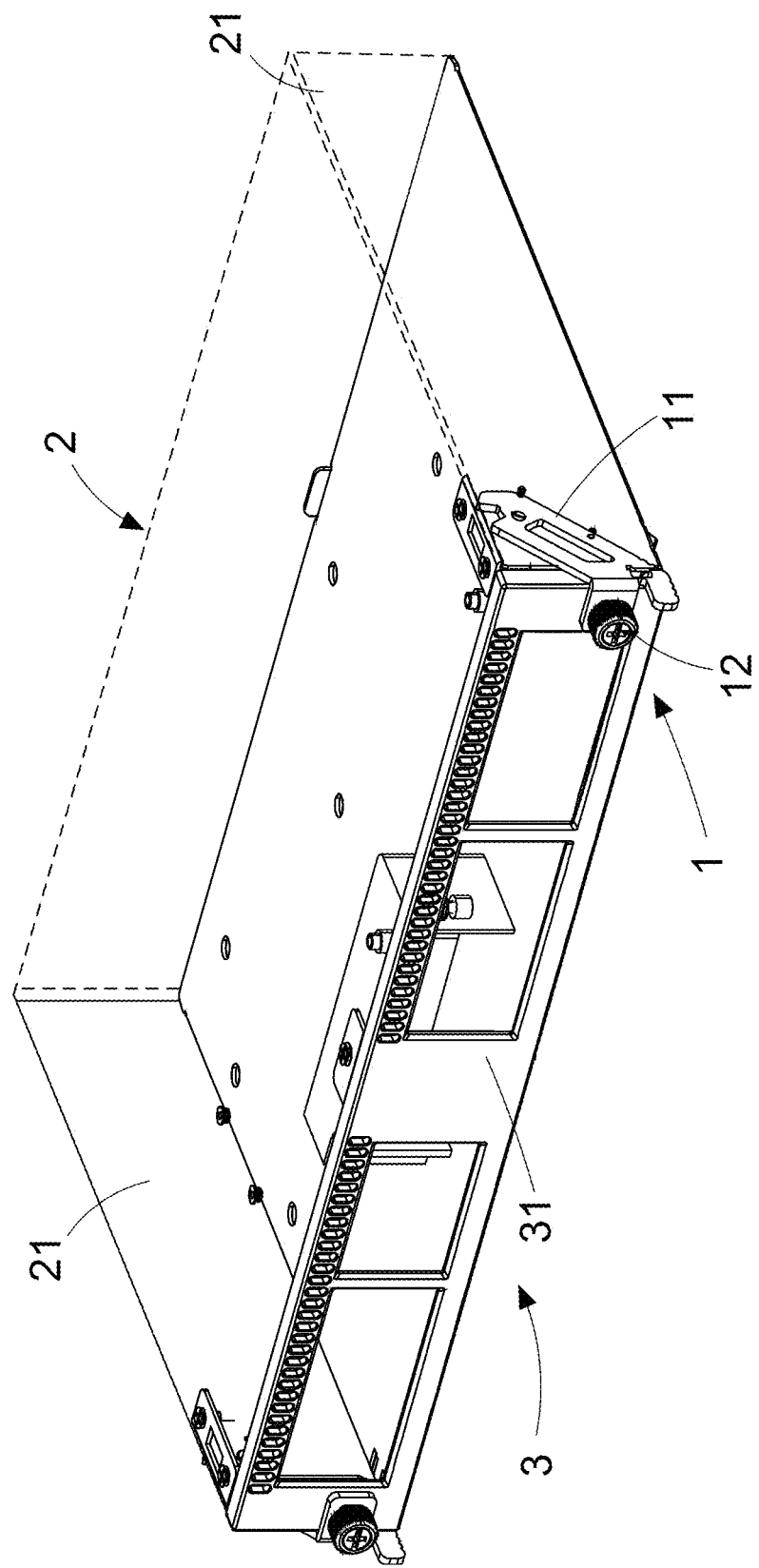
FIG. 2 shows a stereo view of a locking mechanism according to the present invention.

With reference to FIG. 2, which shows a stereo view of a locking mechanism according to the present invention.

Figure 3:
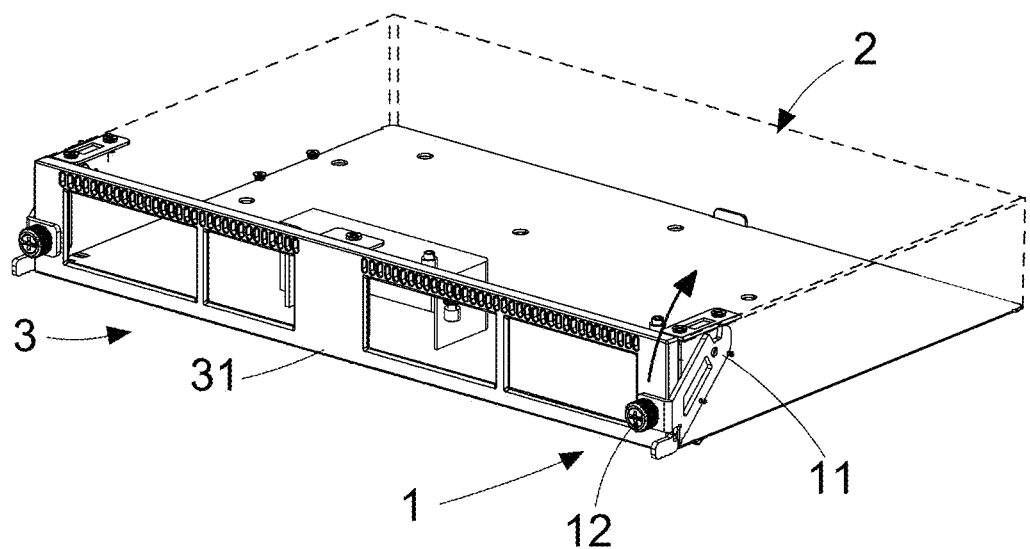
FIG. 3 shows a first schematic stereo view of a locking mechanism according to the present invention.
Figure 3:
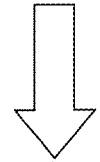
Figure 3:
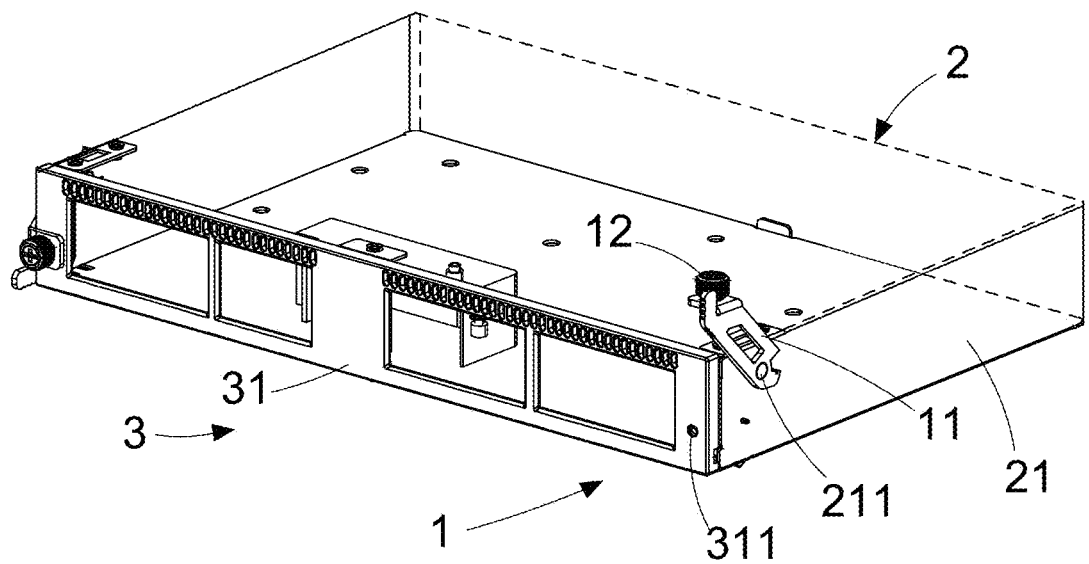

Please simultaneously refer to FIG. 3, which shows a first schematic stereo view of a locking mechanism according to the present invention. From FIG. 3, it is understood that the locking mechanism 1 for applying in a computer case 2 and comprises: an actuating unit 11 and a locking member 12. Wherein, the actuating unit 11 is connected to one of two vertically-disposed side plates 21 of the computer case 2, and comprises: a pivot member 111 and a latching member 112. More particularly, the pivot member 111 is pivotally connected to a connection portion 211 of the vertically-disposed side plate 21 by one end thereof. Moreover, the latching member 112 is connected to the other end of the pivot member 111. The locking member 12 is connected to the latching member 112, and is configured to lock a front plate 31 having at least one locking hole 311 of the sliding member 3. As shown in FIG. 2, when the actuating unit 11 is set to be in a locked state, the latching member 112 locks the front plate 31 of the sliding member 3. More particularly, the locking member 12 is configured to lock a front plate 31 having at least one locking hole 311, such that the sliding member 3 is firmly disposed in the computer case 2. As shown in FIG. 3, two side of the computer case 2 both be disposed the locking mechanism 1 under actual operating conditions. On the other hand, the sliding member 3 is used for loading a plurality of electronic components. The computer case 2 is applying for a host computer, and the host computer is selected from the group consisting of computer host device, server computer, desk computer, laptop computer, and a minicomputer case. According to particular design of the present invention, a user is capable of easily locking the sliding member 3 in the computer case 2.

Figure 4:
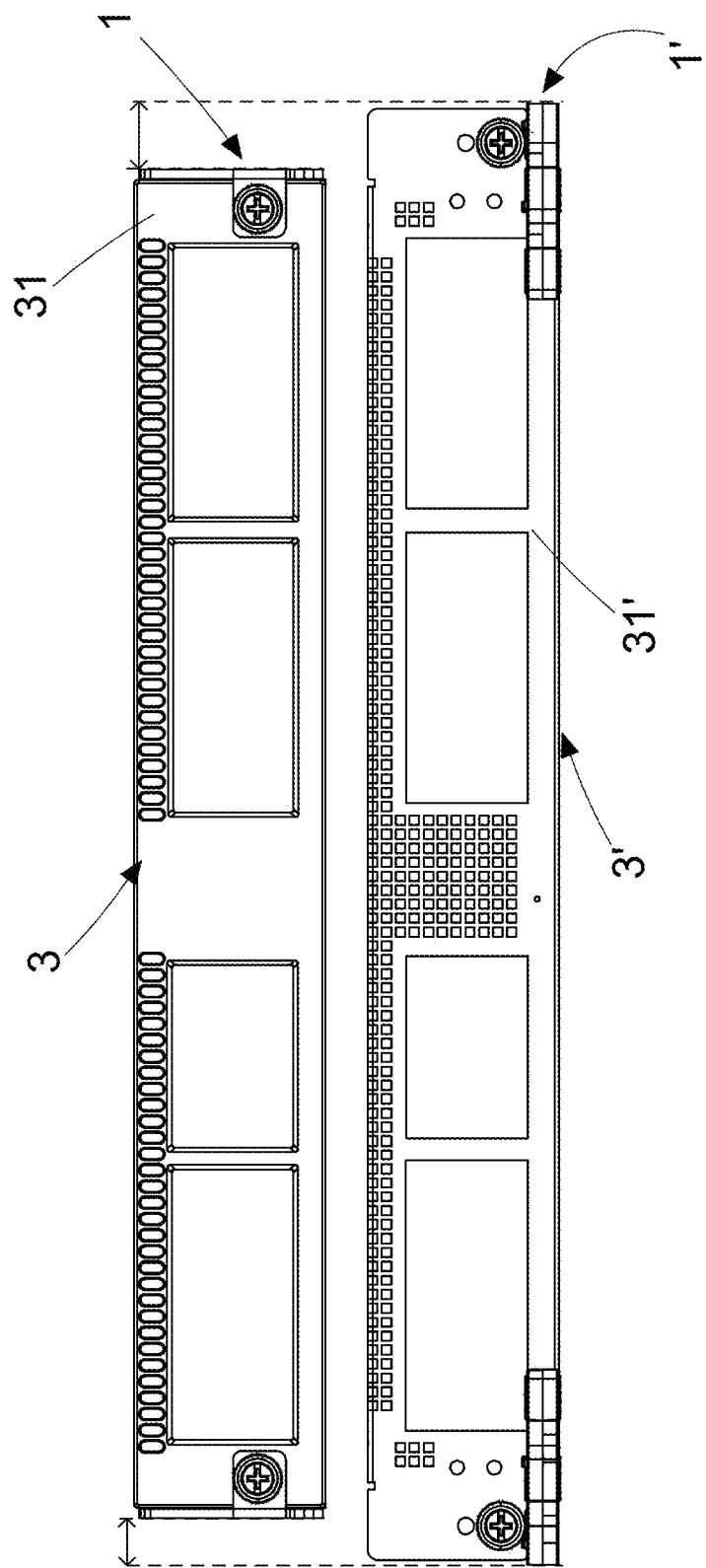
FIG. 4 shows a comparison view between locking mechanism of convention and the present invention.

Continuously referring to FIG. 2 and FIG. 3. Please simultaneously refer to FIG. 4, which shows a comparison view between locking mechanism of convention and the present invention. Inheriting to above descriptions, a locking of the locking member 12 to the front plate 31 of the sliding member 3 is released by a first external force when the user wants to draw the sliding member 3 to replace or examine the plurality of the electronic components. Moreover, by applying a second external force to the actuating unit 11, the actuating unit 11 rotates along a first direction parallel to the vertically-disposed sides 21 as a rotation, so as to switch the actuating unit 11 to be in an unlocked state, such that the sliding member 3 is allowed to be drawn out from the computer case 2. In other words, the user just needs to release the locking of the locking member 12 to the front plate 31, and the actuating unit 11 be rotated around a connection between the vertically-disposed sides 21 and thereof, thus the sliding member 3 is allowed to be drawn out from the computer case 2. As shown in FIG. 4, it is noted that the locking mechanism 1 of the present invention includes advantages of more available space and cost reduction by comparing the conventional locking mechanism 1' with the locking mechanism 1 of the present invention.

Figure 5:
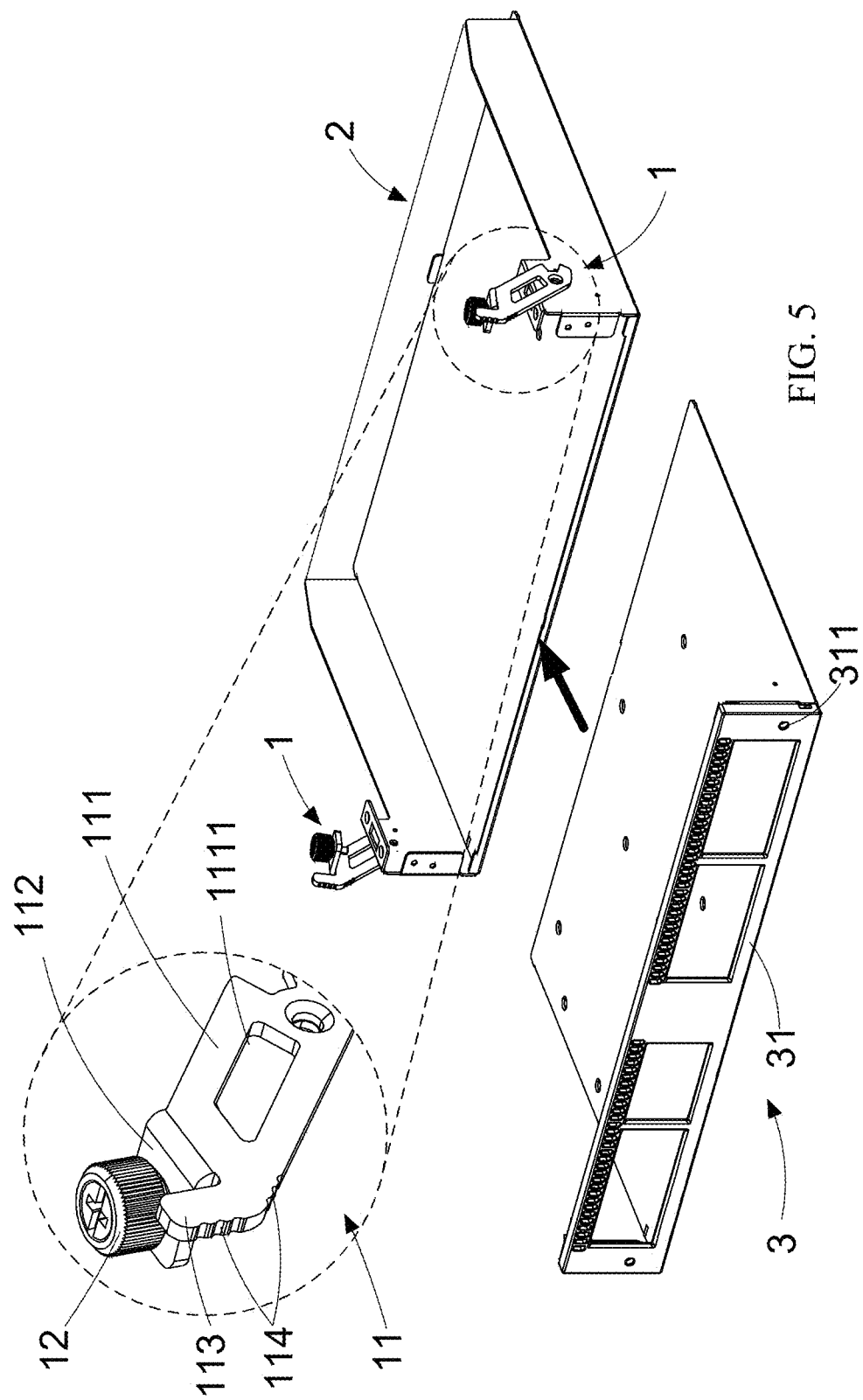
FIG. 5 shows a second schematic stereo view of a locking mechanism according to the present invention.

Continuously referring to FIG. 2, FIG. 3 and FIG. 4. Please simultaneously refer to FIG. 5, which shows a second schematic stereo view of a locking mechanism according to the present invention. It needs to further explain that, the locking member 12 comprises a fixed ring and a rotating element. Wherein the fixed ring is engaged with a through hole of the latching member 112. The rotating element is connected to the fixed ring and is screwed in the at least one locking hole 311. By such arrangements, the rotating element is rotated to be unscrewed by the first external force to stop locking the front plate 31. As shown in FIG. 5, the actuating unit 11 comprises a convex member 113. The convex member 113 is connected to the pivot member 111 and extending out beyond a position of the front plate 31 by one end thereof, and the convex member 113 is used for facilitating an application of the first external force on the actuating unit 11 be easily. Furthermore, the actuating unit 11 comprises an anti-slip portion 114 which is disposed on a lower surface of the convex member 113 and a lower surface of the pivot member 111 to increase a surface friction of the actuating unit 11. More particularly, the anti-slip portion 114 is an irregular surface.

Inheriting above description, the pivot member 111 comprises a hollow portion 1111. The hollow portion 1111 is formed on the pivot member 111 to decrease a surface friction between the actuating unit 11 and the vertically-disposed side plate 21 when the actuating unit 11 pivotally rotating and to reduce the material usage thereof. In the present invention, the actuating unit 11 is rotated along the first direction parallel to the vertically-disposed side plate 21, so as to increase the available space of the front plate 31 and space usage efficiency of the computer case 2 which is used with the locking mechanism 1.

Therefore, through above descriptions, the locking mechanism proposed by the present invention have been introduced completely and clearly; in summary, the present invention includes the advantages of:

(1) Differing from the conventional locking mechanism 1' having the disadvantages of lower available spaces and high production cost. The locking mechanism 1 of the present invention comprises: an actuating unit 11 and a locking member 12. The actuating unit 11 is connected to one of the two vertically-disposed side plates 21 of the computer case 2 by one end thereof, and comprises a pivot member 111 and a latching member 112. In the present invention, the actuating unit 11 is rotated along a first direction parallel to the vertically-disposed side plate 21 by taking the connection portion of the vertically-disposed side plate 21 as a rotation by applying a second external force. In other words, by the particular design of the first direction parallel to the vertically-disposed side plate 21, so as to decrease space required by operating the locking mechanism 1, such that the locking mechanism 1 includes advantages of great space-saving, high capacity and low cost of production cost.

The above description is made on embodiments of the present invention. However, the embodiments are not intended to limit scope of the present invention, and all equivalent implementations or alterations within the spirit of the present invention still fall within the scope of the present invention.

What is claimed is:
1. A locking mechanism for applying in a computer case that has two vertically-disposed side plates, and comprising:
   an actuating unit, being pivotally connected to one of the two vertically-disposed side plates, and comprising:
      a pivot member, being pivotally connected to a connection portion of the vertically-disposed side plate by one end thereof;
      a latching member, being connected to the other end of the pivot member, and being configured to lock a sliding member; wherein the sliding member is arranged to slide in the computer case; and
   a locking member, being connected to the latching member, and being configured to lock a front plate having at least one locking hole of the sliding member;
   wherein in case of the actuating unit being set to be in a locked state, the latching member locking the front plate of the sliding member, and the locking member locking at least one locking hole of the front plate;

wherein a locking of the locking member to the front plate is released by a first external force;

wherein by applying a second external force to the actuating unit, the actuating unit rotating along a first direction parallel to the vertically-disposed side plate by taking the connection portion of the vertically-disposed side plate as a rotation, so as to switch the actuating unit to be in an unlocked state, such that the sliding member is allowed to be drawn out from the computer case.

2. The locking mechanism of claim 1, wherein the locking member comprises:

a fixed ring, being engaged with a through hole of the latching member; and a rotating element, being connected to the fixed ring, and being screwed in the at least one locking hole of the front plate;

wherein the rotating element is rotated to be unscrewed by the first external force to stop locking the front plate.

3. The locking mechanism of claim 1, wherein the actuating unit comprises:

a convex member, being connected to the pivot member and extending out of the front plate by one end thereof;

wherein the convex member is used for facilitating an application of the first external force on the actuating unit be easily.

4. The locking mechanism of claim 2, wherein the computer case is applying for a host computer, and the host computer is selected from the group consisting of computer host device, server computer, desk computer, laptop computer, and a minicomputer case.

5. The locking mechanism of claim 1, wherein the pivot member comprises:

a hollow portion, being formed on the pivot member to decrease a surface friction between the actuating unit and the vertically-disposed side plate when the actuating unit pivotally rotating.

6. The locking mechanism of claim 1, wherein the actuating unit comprises:

an anti-slip portion, being disposed on a lower surface of the convex member and a lower surface of the pivot member to increase a surface friction of the actuating unit.

* * * * *